United States Patent
Chung et al.

(10) Patent No.: US 7,161,293 B2
(45) Date of Patent: Jan. 9, 2007

(54) ORGANIC ELECTROLUMINESCENT DISPLAY AND METHOD FOR MAKING SAME

(75) Inventors: Chia-Tin Chung, Miao Li (TW); Su-Jen Chang, Bing Dong (TW); Andrea Hwang, Zhang Hwa (TW); Chen-Ze Hu, Zhong Ho (TW)

(73) Assignees: Chi Mei Optoelectronics Corporation, Tainan (TW); Kyocera Corporation, Kyoto (JP)

( * ) Notice: Subject to any disclaimer, the term of this patent is extended or adjusted under 35 U.S.C. 154(b) by 462 days.

(21) Appl. No.: 10/687,378

(22) Filed: Oct. 16, 2003

(65) Prior Publication Data

US 2004/0080265 A1    Apr. 29, 2004

Related U.S. Application Data

(62) Division of application No. 09/731,314, filed on Dec. 5, 2000, now Pat. No. 6,669,856.

(30) Foreign Application Priority Data

Oct. 2, 2000   (TW) ............................. 89120490 A

(51) Int. Cl.
  *H01J 1/62*   (2006.01)
  *H01J 63/04*   (2006.01)

(52) U.S. Cl. ...................... 313/504; 313/506; 313/512; 313/292

(58) Field of Classification Search ................. 313/498, 313/504, 506, 507, 512, 292
See application file for complete search history.

(56) References Cited

U.S. PATENT DOCUMENTS

| | | | | | |
|---|---|---|---|---|---|
| 5,701,055 | A | * | 12/1997 | Nagayama et al. | 313/504 |
| 5,834,894 | A | * | 11/1998 | Shirasaki et al. | 313/509 |
| 6,137,220 | A | * | 10/2000 | Nagayama et al. | 313/504 |
| 6,339,288 | B1 | | 1/2002 | Qian et al. | |
| 6,373,187 | B1 | * | 4/2002 | Nagayama et al. | 313/506 |
| 6,469,439 | B1 | * | 10/2002 | Himeshima et al. | 313/506 |
| 6,669,856 | B1 | | 12/2003 | Chung et al. | |

* cited by examiner

*Primary Examiner*—Nimeshkumar D. Patel
*Assistant Examiner*—Kevin Quarterman
(74) *Attorney, Agent, or Firm*—Baker & McKenzie LLP

(57) ABSTRACT

An organic electroluminescent display apparatus and method for manufacturing same is disclosed; the method prevents the anode and the cathode from defects and short circuit, and with the suitable geometry of the electrical insulation ramparts, the mechanical properties of the cathode insulating ramparts are increased such that the adhesion between the cathode insulating ramparts and the substrate is enhanced.

15 Claims, 3 Drawing Sheets

ORGANIC ELECTROLUMINESCENT DISPLAY AND METHOD FOR MAKING SAME

This application claims priority to and is a divisional application of U.S. patent application Ser. No. 09/731,314 filed Dec. 5, 2000 now U.S. Pat. No. 6,669,856 entitled "Organic Electroluminescent Display and Method for Making Same".

BACKGROUND OF THE INVENTION

1. Field of the Invention

The present invention relates generally to organic electroluminescent displays, and more particularly to a structure of a cathode rampart of an organic electroluminescent display.

2. Description of the Related Art

With the advent of the information technology age, there is an increasing demand for high-quality electro-optical displays, in which liquid crystal displays (LCD) are the most popular. A LCD backlight module comprising a light guide and a reflective plate is utilized for introducing the light beams, emitted from the cold cathode fluorescent lamp, vertically to the liquid crystal display panel, in which the liquid crystal contained therein controls the illuminance of the LCD. Conventional LCD has a limited view angle and requires very complicated manufacturing processes, which result in high manufacturing costs and relatively low yields. However, organic electroluminescent displays (OELD) have larger view angle and can be produced through less complex manufacturing process. These advantages are based on the self-luminance of the organic elements in the organic electroluminescent displays, which results in the unrestricted visual angles, more natural colors displayed, increased operational temperature range and shorter response time.

Organic electroluminescent displays generally include cathodes, organic electroluminescent materials and anodes, which are stacked in sequence on a substrate of glass. The cathodes and the anodes are respectively composed of a plurality of electrodes disposed in a parallel stripes formation, and the cathodes and anodes are configured perpendicular to each other. Organic electroluminescent materials are disposed at the intersections of the cathodes and the anodes, and are separated by insulating materials. Accordingly, the cathodes, the organic electroluminescent materials and the anodes form a three-layer structure disposed on the substrate. When a voltage difference between the cathodes and the anodes is present, the organic electroluminescent material emits light beams.

The metal electrodes of the cathodes are coated through evaporation on the organic electroluminescent material after the organic electroluminescent material and the insulating materials are formed. However, the cathodes composed of metal electrodes are easily diffused along the gaps between the organic electroluminescent material and the insulating materials during the formation step. Once the cathodes contact the anodes, it will short circuit and the organic electroluminescent materials between the cathodes and the anodes can not emit light.

If foreign particles fall aside the insulating materials as defects before the electrodes of the cathode are formed by coating through evaporation, metal materials will be formed around the foreign particles during the formation step and a short circuit is likely between neighboring metal electrodes.

Furthermore, during the manufacturing process of full-color organic electroluminescent displays (FOELD), it is necessary to utilize shadow masks for partially masking the organic electroluminescent material. After the organic electroluminescent material layer for emitting light beams of one color is coated on the anodes, the shadow masks are moved so as to form another organic electroluminescent material layer for emitting light beams of another color. In this case, the shadow masks will contact the insulating materials directly during the formation of the second organic electroluminescent material layer. This will cause the insulating materials to be peeled off and deteriorate the organic electroluminescent material.

In the prior art, forming a plurality of cathode ramparts in the direction perpendicular to anode electrodes to separate cathode electrodes arranged in parallel from each other is disclosed. With the exposure at the side of the cathode ramparts, since the exposure is focused mostly at the upper portion of the cathode ramparts, the portion of the cathode ramparts adjacent to the anode electrodes is not of sufficiently cross-linking and consequently the mechanical performance thereof is not significantly high. This results in the cathode ramparts being easily peeled off while contacting the shadow masks due to the deterioration of the adhesion between the ramparts and the substrate.

If the adhesion between cathode ramparts and substrate is strengthened by revising the parameters in photolithography process, the geometry of the cathode ramparts can not be effectively used as a mask during the coating of the cathode electrodes through evaporation.

SUMMARY OF THE INVENTION

In view of the above problems, the principal object of the present invention is to provide an organic electroluminescent display and a method for manufacturing same, which prevents the anode and the cathode from defects and short circuit, and with the suitable geometry of the electrical insulation ramparts, the mechanical properties of the cathode insulating ramparts are increased such that the adhesion between the cathode insulating ramparts and the substrate is enhanced.

To achieve this object, the present invention provides an organic electroluminescent display, comprising a plurality of first display electrodes disposed in parallel on a substrate; a plurality of second display electrodes arranged in parallel, disposed on the first display electrodes and being perpendicular thereto; a plurality of organic electroluminescent materials disposed between the first display electrodes and the second display electrodes for emitting light and electrical insulation between the first and second display electrodes; a plurality of insulating ramparts disposed between neighboring two second display electrodes and arranged in parallel thereto; and overhangs disposed on the portion of the insulating ramparts away from the substrate, the portion of the insulating ramparts proximate to the substrate having a sufficiently high cross-linking such, that better adhesion between insulating ramparts and the first display electrodes is ensured.

The present invention also provides a method for manufacturing an organic electroluminescent display, comprising the steps of forming a plurality of first display electrodes of high light transmission arranged in parallel on a transparent substrate; forming an insulating layer on the transparent substrate, the insulating layer including a plurality of slots perpendicular to the first display electrodes for exposing the first display electrodes; forming cathode ramparts on the exposed first display electrodes, the portion of the cathode ramparts away from the substrate providing overhangs of greater width, and the portion of the cathode ramparts proximate to the substrate having sufficiently high cross-linking for increasing the adhesion between the cathode ramparts and the first display electrodes; removing the insulating layer partially by means of the masking effect of the overhangs of the cathode ramparts for exposing the first display electrode; forming an organic electroluminescent material on the exposed first display electrodes; and forming a plurality of second display electrodes on the organic electroluminescent material.

It should be noted that the step of forming the insulating ramparts may further comprise the steps of forming a blanket of photosensitive material on the insulating layer, illuminating the photosensitive material from one side of the substrate opposite to the first display electrodes with the insulating layer as photo masks; and proceeding a development process to the photosensitive material to expose the insulating layer. Since the light beams are from the side opposite to the first display electrodes, the cross-linking at the portion of the insulating ramparts proximate to the substrate is more significant than at the portion away from the substrate. Therefore, the adhesion between the ramparts and the substrate is enhanced.

The present invention further provides a method for manufacturing an organic electroluminescent display, comprising the steps of forming a plurality of first display electrodes of high light transmission on a transparent substrate; forming an opaque insulating layer on the transparent substrate, the opaque insulating layer including a plurality of slots at predetermined locations; forming a photosensitive insulating layer on the substrate; illuminating the photosensitive insulating layer from light beams passing through the substrate and the first display electrodes in sequence with the opaque insulating layer as photo masks; removing the unilluminated portion of the photosensitive insulating layer to form insulating ramparts; proceeding an anisotropic etching process to the opaque insulating layer for exposing the first display electrodes; forming an organic electroluminescent. material on the exposed first display electrodes; and forming a plurality of second display electrodes on the organic electroluminescent material.

Additional advantages, objects and features of the present invention will become more apparent from the drawings and description which follows.

BRIEF DESCRIPTION OF THE DRAWINGS

The present invention will become more apparent from the detailed description given hereinbelow when read in conjunction with the accompanying drawings, which are given by means of illustration only and thus are not limitative of the present invention, in which:

FIGS. 2A–2G are sectional views of an organic electroluminescent display according to the present invention illustrating the manufacture processes in sequence, wherein FIGS. 2B, 2C are cross-sectional views taken along 2B—2B and 2C—2C of FIG. 1A respectively, and FIG. 2F is a cross-sectional view taken along 2F—2F of FIG. 1B.

Figure 1A:
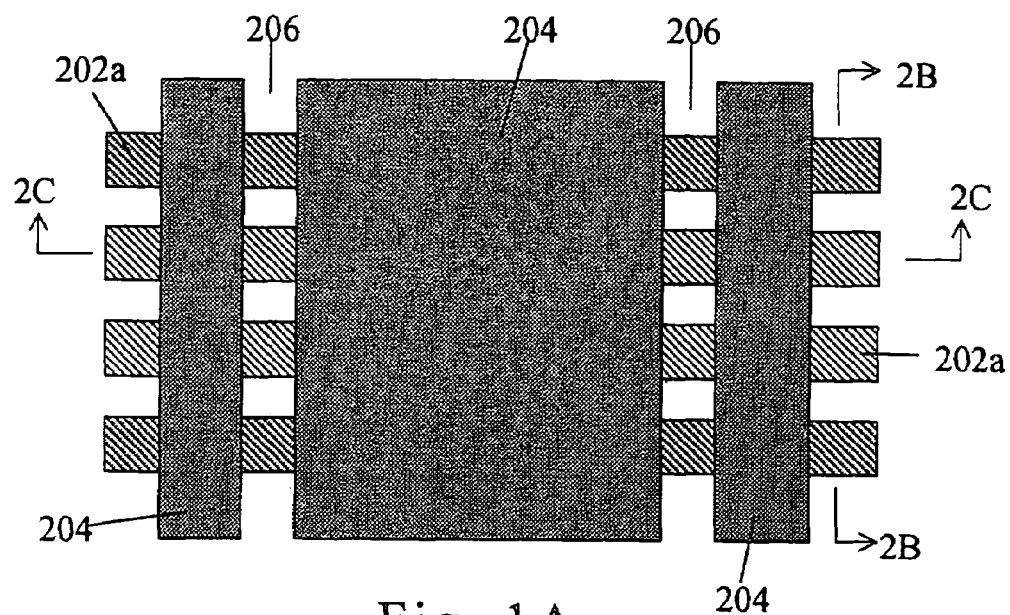
FIGS. 1A and 1B are top views showing an organic electroluminescent display according to a preferred embodiment of the present invention.

| Brief Description of the Reference Numerals | |
|---|---|
| 200 | substrate |
| 202 | transparent conductive material |
| 202a | anode electrodes |
| 204 | opaque insulating material |
| 206 | opening |
| 208 | photosensitive insulating material |
| 208a | cathode rampart |
| 208b | overhang |
| 210 | light source for exposure |
| 212 | illuminated region |
| 214 | organic electroluminescent material |
| 216 | metal conductive material |

DETAILED DESCRIPTION OF THE PREFERRED EMBODIMENT

Figure 2A:
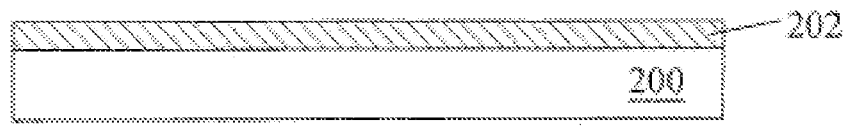
Figure 2B:
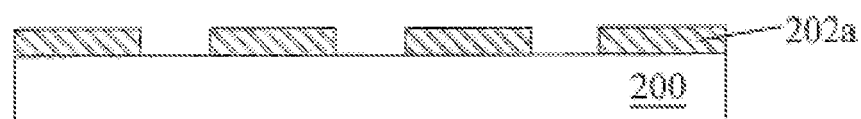

With reference to FIG. 2A, a substantially transparent conductive material 202, such as indium tin oxide (ITO) or $In_2O_3$—ZnO, is first formed on a substrate 200, such as a transparent glass substrate or a flexible, light-transmitting plastic substrate, by a sputtering process. Next, photoresists are provided on the conductive material 202 as masks such that a plurality of anode electrodes 202a of transparent conductive material of stripe shapes arranged in parallel are formed from the conductive material 202 after a photolithography process for removing the portions of the conductive material 202 unmasked by the photoresists. Accordingly, the portions of the substrate 200 unmasked by the photoresists are exposed (see FIGS. 1A and 2B).

Figure 2C:

With reference to FIGS. 1A and 2C, a blanket of opaque insulating material, such as non-photosensitive polyimide doped with dark pigments, is spin-coated on the anode electrodes 202a about 1–2 μm thickness for covering both the anode electrodes 202a and the substrate 200 exposed. Then, a photolithography process or developers may be introduced to remove the opaque insulating material at predetermined locations so that the insulating material 204 of a pattern shown in FIG. 1A is defined and at least anode electrodes 202a are partially exposed. Slots 206 of stripe shapes parallel to each other and perpendicular to the direction of the anode electrodes 202a are therefore formed. Regions between two adjacent slots 206 functions as luminescent regions of the organic electroluminescent displays and the width of such regions is about 50–300 μm depending on the resolution of the organic electroluminescent displays. The width of the slots 206 is about 5–30 μm for forming cathode ramparts in later steps.

Figure 2D:
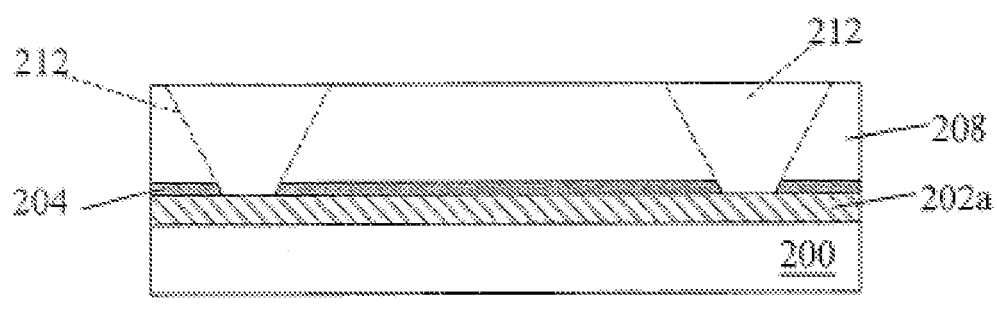
Figure 2D:

With reference to FIG. 2D, a blanket of photosensitive insulating materials 208 is formed on the insulating material 204 as negative photoresists and thereby filling the slots 206 and covering the substrate 200. The photosensitive insulating materials 208 can be, for example, spin-coated on the substrate about 3–5 μm thickness. Such negative photoresists are capable to be blanketed on the substrate 200 and the thickness thereof is not necessary to be significantly thick, so that the manufacturing cost can be conserved. Subsequently, a light source 210 for exposure is provided at the side opposite to the photosensitive insulating materials 208. The light beams 210 emitted from the light source can be parallel or not. Alternatively, an ultra-violet light source can be utilized to improve the baking effect for the photosensitive insulating material 208 and to reduce the cost.

The light beams 210 emitted from the light source penetrate into the substrate 200 and further pass through the anode electrodes 202a and slots 206. While the light beams 210 impinge the photosensitive insulating materials 208, an exposure process is introduced thereto. Since the insulating material 204 is opaque, it functions as masks to resist the light beams from passing through, so that only light beams passing through the slots 206 impinge the photosensitive insulating materials 208 for exposure. Regions 212 between two corresponding divergent dotted lines indicate the regions of the photosensitive insulating material 208 illuminated by the light beams. It should be noted that the region 212 has a reverse-tapered cross-section due to the non-parallel light beams incident thereto. After removing the portion of the photosensitive insulating materials 208 not illuminated by the light beams with a developer solution, cathode ramparts 208a of stripe shapes arranged substantially in parallel are formed (see FIGS. 2E and 1B). At this stage, infrared rays or other heat source can be utilized for baking the cathode ramparts 208a to enhance the structural stability.

Since the opaque insulating materials 208 are formed on the substrate 200, the step of forming cathode ramparts by photo masks through exposure from the side of the photosensitive insulating materials 208 in the prior art can be omitted. In addition, while the substrate 200 is flexible, such as a transparent flexible plastic substrate, the opaque insulating materials 208 will be bent corresponding to the substrate 200, so that the alignment between the photo masks and the substrate can be ensured and the exposure effect will not be affected by the flexibility of the substrate.

In the above mentioned exposure process, since the portion of the cathode ramparts 208a proximate to the substrate 200 receives more energy from the light beams than the portion away from the substrate 200, more photo initiators within the photosensitive insulating material 208 proceed cross-linking adjacent to the slots 206. Therefore, the cross-linking effect at the portion of the cathode ramparts 208a proximate to the substrate 200 is more significant than at the portion far from the substrate 200, whereby the adhesion between the cathode ramparts 208a and the substrate 200 is enhanced for preventing the cathode ramparts 208a from peeling off.

Since the light beams from the light source 210 are not limited to be in parallel, the shape of the cathode ramparts 208a corresponds to the region illuminated by light beams and will be a reverse-tapered cross-sectional configuration in which overhangs 208b of greater width are formed at the portion of the cathode ramparts 208a far from the substrate 200. Therefore, the angle θ between the substrate 200 and the outer circumference of the cathode ramparts 208a is less than 80 degrees, preferably in a range of 40–80 degrees due to the non-parallel light beams incident to the cathode ramparts 208a and the insulating materials 204 as optical gratings. Since the angle θ according to the present invention is smaller than that in the prior art, the height of the cathode ramparts 208a of the present invention can be reduced to 1–5 μm for implementing the same masking effect as in the art.

Figure 1B:
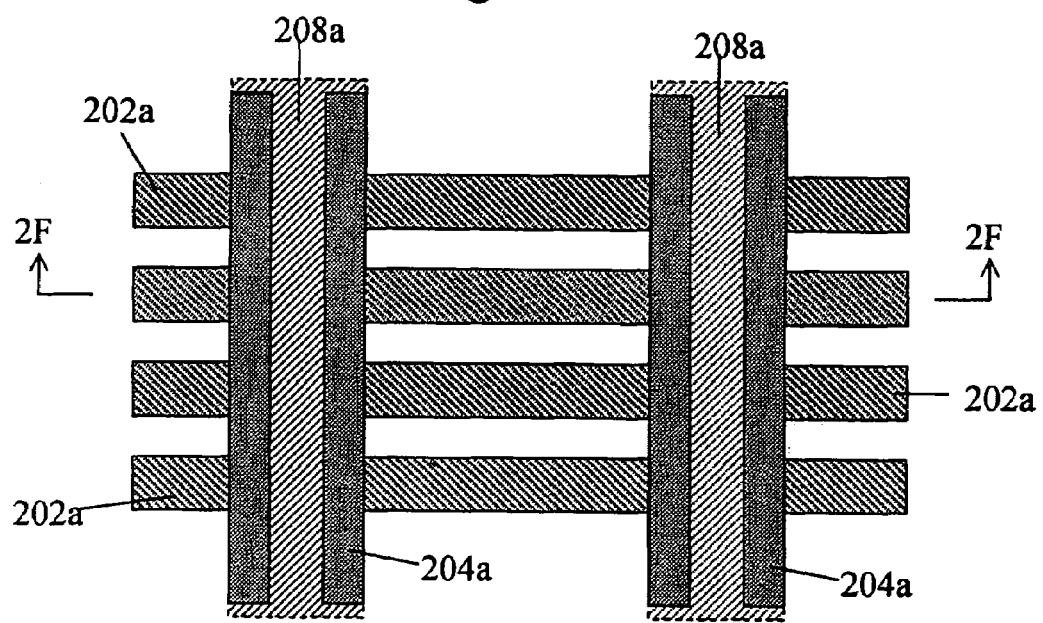
Figure 2E:
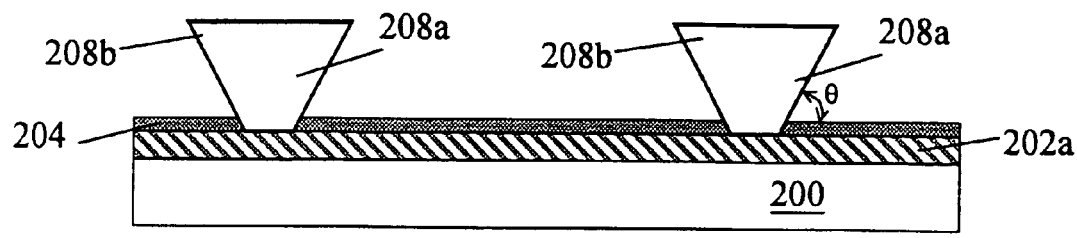
Figure 2F:
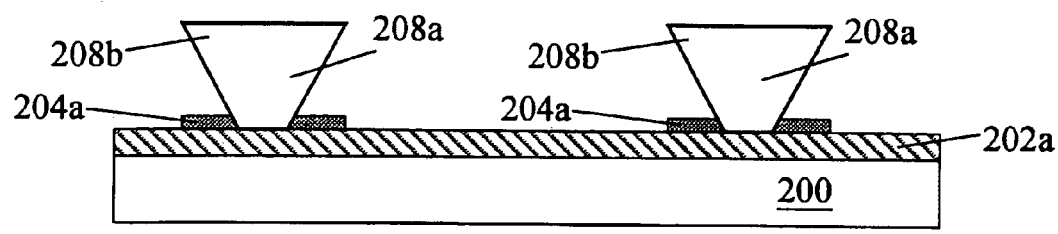

With reference to FIGS. 2F and 1B, after the overhangs 208b of the cathode ramparts 208a are formed, an anisotropic etching process, such as an reactive-ion etching (RIE) or plasma etching, is conducted to the opaque insulating materials 204. With the masking effect of the overhangs 208b, the resultant insulating materials 204a are substantially parallel to the cathode rampart layers 208a and are substantially perpendicular to the anode electrodes 202a, thereby exposing partially the anode electrodes 202a (see FIG. 1B).

Figure 2G:
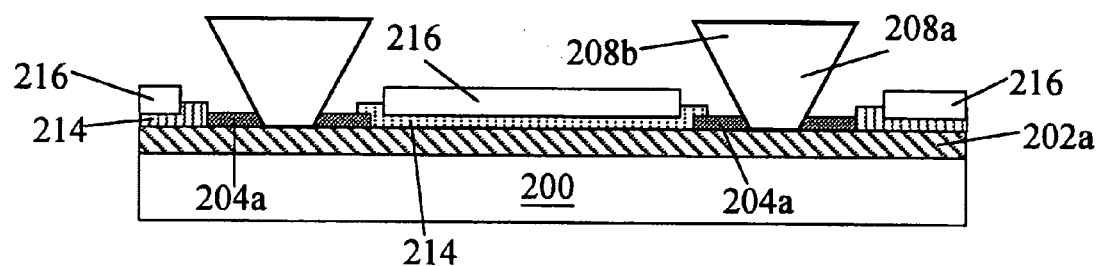

Next, organic electroluminescent materials 214 are formed on the exposed anode electrodes 202a (see FIG. 2G). While producing single-color organic electroluminescent displays, an organic electroluminescent layer is coated through evaporation on the exposed anode electrodes 202a. While producing full-color organic electroluminescent displays, RGB organic electroluminescent layers are formed in turn on the exposed anode electrodes 202a by using shadow masks. Subsequently, metal conductive materials 216, such as Al, Mg—Al alloy or other suitable metal materials, are formed on the organic electroluminescent materials 214 as cathode electrodes of the organic electroluminescent displays.

With reference to FIG. 2G, metal conductive materials 216 are formed on the organic electroluminescent materials 214 without damaging the metal conductive materials 216 due to the masking effect of the overhangs 208b of the cathode ramparts 208a. In addition, the short circuit between the metal conductive materials 216 and the anode electrodes. 202a is avoided due to the presence of the cathode ramparts 208a and the insulating materials 204a.

According to the present invention, adhesions between the cathode ramparts and the substrate and between the cathode ramparts and the transparent conductive materials are enhanced such that the shadow masks will not be damaged while coating organic electroluminescent materials through evaporation. In addition, since the cathode ramparts are formed through exposure from the side opposite to the photosensitive insulating materials, and better masking effect can be achieved by means of the small angle between the substrate and the cathode ramparts according to the present invention, thick photosensitive materials, light sources emitting parallel light beams and providing additional one photo mask are not necessary such that the manufacturing cost can be significantly reduced.

Although the preferred embodiments of the present invention have been disclosed for illustrative purposes, those skilled in the art will appreciate that various modifications, additions and substitutions are possible, without departing from the scope and spirit of the present invention as recited in the accompanying claims.

What is claimed is:

1. An organic electroluminescent display, comprising:
a plurality of parallel first display electrodes, located on a substantially transparent substrate;
an opaque insulating layer, formed over the substrate and partially exposing the first display electrodes, wherein the opaque insulating layer includes a plurality of slots;
a plurality of insulating ramparts, located on the display electrodes and protruding from the slots of the opaque insulating layer;
an organic electroluminescent material, disposed on exposed regions of the first display electrodes; and
a plurality of second display electrodes, located on the organic electroluminescent material, the second display electrodes being perpendicular to the first display electrodes.

2. The organic electroluminescent display according to claim 1, wherein the insulating ramparts extend in overhang portions having a tapered section, a side of the tapered section forming an angle of about 40–80 degrees with the substrate.

3. The organic electroluminescent display according to claim 1, wherein the thickness of the insulating ramparts is in a range of about 1–5 mm.

4. The organic electroluminescent display according to claim 1, wherein cross-linking is in a greater amount in a portion of the insulating ramparts in proximity to the substrate than in a portion of the insulating ramparts further away from the substrate.

5. The organic electroluminescent display according to claim 1, wherein the opaque insulating layer is made of polyimide incorporated with dark pigments.

6. The organic electroluminescent display according to claim 1, wherein the opaque insulating layer has a thickness of about 1–2 mm.

7. The organic electroluminescent display according to claim 1, wherein the slots of the opaque insulating layer has a width of about 5–30 mm.

8. The organic electroluminescent display according to claim 1, wherein the insulating ramparts are made of a photoresist material.

9. An organic electroluminescent display, comprising:
 a first display electrode on a substantially transparent substrate;
 a pattern of opaque insulating layer, disposed on the first display electrode;
 a pattern of insulating ramparts, placed on the first display electrode, wherein the insulating ramparts have overhang portions overlapping the pattern of opaque insulating layer;
 an organic electroluminescent material, located on the first display electrode between the insulating ramparts; and
 a second display electrode, located on the organic electroluminescent material.

10. The organic electroluminescent display according to claim 9, wherein the insulating ramparts extend into overhang portions having a tapered section, a side of the tapered section forming an angle of about 40–80 degrees with the substrate.

11. The organic electroluminescent display according to claim 9, wherein the thickness of the insulating ramparts is in a range of about 1–5 mm.

12. The organic electroluminescent display according to claim 9, wherein cross-linking is in a greater amount in a portion of the insulating ramparts in proximity to the substrate than in a portion of the insulating ramparts further away from the substrate.

13. The organic electroluminescent display according to claim 9, wherein the opaque insulating layer is made of polyimide incorporated with dark pigments.

14. The organic electroluminescent display according to claim 9, wherein the opaque insulating layer has a thickness of about 1–2 mm.

15. The organic electroluminescent display according to claim 9, wherein the insulating ramparts are made of a photoresist material.

* * * * *